United States Patent
Miyake et al.

(10) Patent No.: US 6,756,739 B2
(45) Date of Patent: Jun. 29, 2004

(54) ORGANIC ELECTROLUMINESCENCE DISPLAY PANEL

(75) Inventors: Takako Miyake, Saitama (JP); Kenichi Nagayama, Saitama (JP)

(73) Assignee: Pioneer Corporation, Tokyo (JP)

(*) Notice: Subject to any disclaimer, the term of this patent is extended or adjusted under 35 U.S.C. 154(b) by 0 days.

(21) Appl. No.: 10/105,158

(22) Filed: Mar. 26, 2002

(65) Prior Publication Data

US 2003/0038595 A1 Feb. 27, 2003

(30) Foreign Application Priority Data

Mar. 28, 2001 (JP) .................................... P2001-093044

(51) Int. Cl.⁷ .............................................. H05B 33/22
(52) U.S. Cl. ..................... 315/169.3; 313/509; 313/504
(58) Field of Search .............................. 313/504–506, 313/509, 498, 500; 315/169.3, 168, 169.1

(56) References Cited

U.S. PATENT DOCUMENTS 6,461,775 B1 * 10/2002 Pokorny et al. ............... 430/7

FOREIGN PATENT DOCUMENTS

| EP | 0 732 868 A1 | 9/1996 |
| EP | 1 150 165 A1 | 10/2001 |
| JP | 11-97182 | 4/1999 |
| JP | 2000-294380 A | 10/2000 |
| JP | 2002-208475 | 7/2002 |

* cited by examiner

Primary Examiner—Vip Patel
Assistant Examiner—Glenn Zimmerman
(74) Attorney, Agent, or Firm—Sughrue Mion, PLLC (57) ABSTRACT

An organic electroluminescence (EL) display panel comprising a plurality of EL elements arranged through an insulating film, each of said EL elements including a first display electrode, at least one organic functional layer containing a light emitting layer of organic compound and a second display electrode which are successively stacked on a substrate, wherein said insulating film has an OD value of 0.5 or more in a visible light range.

29 Claims, 8 Drawing Sheets

A: CIRCULAR POLARIZING FILTER (RIGHT ANGLE)
B: CIRCULAR POLARIZING FILTER (DIAGONAL DIRECTION)
C: ND FILTER (45% PERIMEABILITY)

ORGANIC ELECTROLUMINESCENCE DISPLAY PANEL

BACKGROUND OF THE INVENTION

1. Field of the Invention

This invention relates to an organic electroluminescence (hereinafter referred to as EL) display panel with a plurality of organic EL elements formed in a prescribed pattern on a substrate. Each of the EL elements is composed of at least one thin film (hereinafter referred to as an organic functional layer) containing a light emitting layer of an organic compound material which exhibits EL emitting light due to current injection.

2. Description of the Related Art

The organic EL element includes an anode transparent electrode, an organic functional layer and a cathode metallic layer which are successively stacked on a transparent substrate. The organic functional layer may be e.g. a single layer of a light emitting layer; a double layer structure composed of an organic hole transporting layer and a light emitting layer; a triple layer structure composed of an organic hole transporting layer, a light emitting layer and an organic layer electron transporting layer; or a laminated structure with an electron- or hole-injected layer inserted between these suitable layers.

The organic EL display panel with a plurality of organic EL elements formed in a prescribed pattern on a substrate can constitute a matrix display panel. The matrix display panel, as disclosed in JP-A-8-315981, canprovide a full-color display. The full-color display is a light emitting device having an image display arrangement consisting of a plurality of light-emitting pixels of organic EL elements arranged in rows and columns which are orthogonal to each other. For example, the matrix display type of display panel includes a plurality of EL elements, each including a row electrode containing a transparent electrode layer, an organic functional layer and a column electrode containing a metallic electrode layer orthogonal to the row electrode, which are successively stacked on a substrate, and a stripe or grid-like insulating film. The row electrodes, each being formed in a belt shape, are arranged in parallel to one another at prescribed intervals. The column electrodes are also arranged likewise. In this way, the matrix display type of display panel has an image display arrangement consisting of a plurality of light emitting pixels of organic EL elements located at crossing points of electrodes in a plurality of rows and columns.

Traditionally, the insulating film was made of a relatively transparent material such as polyimide, or material used in the black matrix of a liquid crystal display.

In the organic EL display panel, generally, the column electrode was made of a metallic material such as Al in view of a work function. However, since the metallic electrode layer of e.g. Al has a high reflectance to visible light, a part of external light incident on the organic EL display panel from the outside is reflected by the column electrode and is emitted from the substrate surface. A part of the external light is also reflected by the substrate itself and becomes reflected light. Therefore, the organic EL display panel itself has a high reflectance and hence could not provide the display with high contrast.

In order to solve the above problem, JP-A-7-142170 discloses an organic EL display panel whose contrast was improved by providing a polarized layer outside the row electrode. However, a polarized filter which is used as the polarized layer is not only expensive, but has high dependency of the reflectance on an angle. This presented a problem that the contrast largely varies according to the viewing angle.

The inventors of this invention have first found the relationship between the reflectance of an insulating film and an optical density abbreviated OD value thereof and succeeded in specifying the OD value which is indispensable to obtain a good reflectance for an organic EL display panel.

SUMMARY OF THE INVENTION

The invention has been accomplished to solve the above problem, and intends to provide an organic EL display panel with improved contrast.

In order to attain the above object, according to a first aspect of the invention, there is provided an organic electroluminescence (EL) display panel comprising a plurality of EL elements arranged through an insulating film, each of said EL elements including a first display electrode, at least one organic functional layer containing a light emitting layer of organic compound and a second display electrode which are successively stacked on a substrate, wherein said insulating film has an OD value of 0.5 or more in a visible light range.

According to a second aspect of the invention, in the organic EL display panel according to the first aspect, said insulating film has a current density of $10^{-8}$ A/mm$^2$ or less when a voltage of 30 V is applied.

According to a third aspect of the invention, in the organic EL display panel according to the first aspect, said insulating film has a volume resistance of $1.0 \times 10^{12}$·Ωcm or more.

According to a fourth aspect of the invention, in the organic EL display panel according to any one of the first to third aspects, an outermost surface of said insulating film has a sloping surface which slopes at an angle smaller than a vertical angle to said substrate in an area oriented toward the surface of said substrate.

According to a fifth aspect of the invention, in the organic EL display panel according to any one of the first to fourth aspects, said insulating film is formed in a grid pattern in at least a part between said organic EL display elements.

According to a sixth aspect of the invention, in the organic EL display panel according to anyone of the first to fifth aspects, said insulating film has a partition on at least a portion of the outermost surface.

According to a seventh aspect of the invention, the organic EL display panel according to any one of the first to sixth aspects further comprises a lightproof layer on the surface of said substrate.

According to an eighth aspect of the invention, in the a organic EL display panel according to the seventh aspect, said lightproof layer is an ND filter.

According to a ninth aspect the invention, in the organic EL display panel according to anyone of the first to sixth aspects, said substrate is a lightproof substrate.

According to a tenth aspect of the invention, in the organic EL display panel according to the ninth aspect, said lightproof substrate is an ND filter.

DETAILED DESCRIPTION OF THE PREFERRED EMBODIMENTS

Now referring to the drawings, an explanation will be given of embodiments of this invention.

Figure 1:
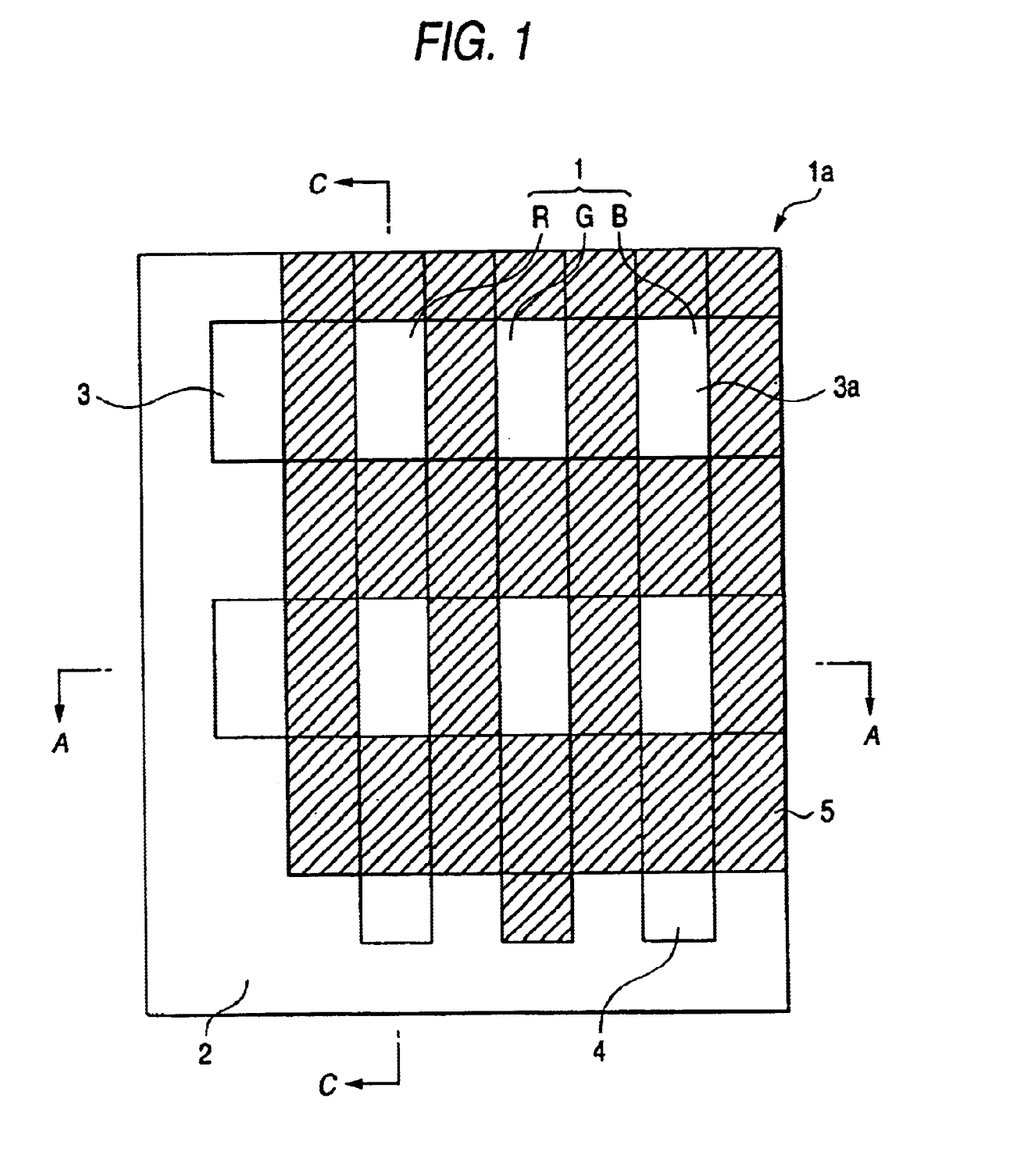
FIG. 1 is a partially enlarged front view when an organic EL display panel according to this invention.

FIG. 1 is a partially enlarged front view when an organic EL display panel is viewed from the front. The organic EL display panel has an image display arrangement region 1a including a plurality of light emitting pixels 1, each consisting of light emitting segments of red (R), green (G) and blue (B), arranged in amatrix shape on a transparent substrate 2 made of e.g. glass. The organic EL display panel has first display electrode lines 3, i.e. anodes which are a plurality of stripes of transparent electrodes in parallel in a horizontal direction, and second display electrodes 4, i.e. cathodes which are a plurality of metallic electrodes in parallel in a vertical direction. Light-emitting segments, i.e. organic EL elements are formed at points of transparent electrodes 3a where the anodes and the cathodes cross each other. A black insulating layers 5 are formed in a grid pattern so as to surround each of the organic EL elements.

Figure 2:
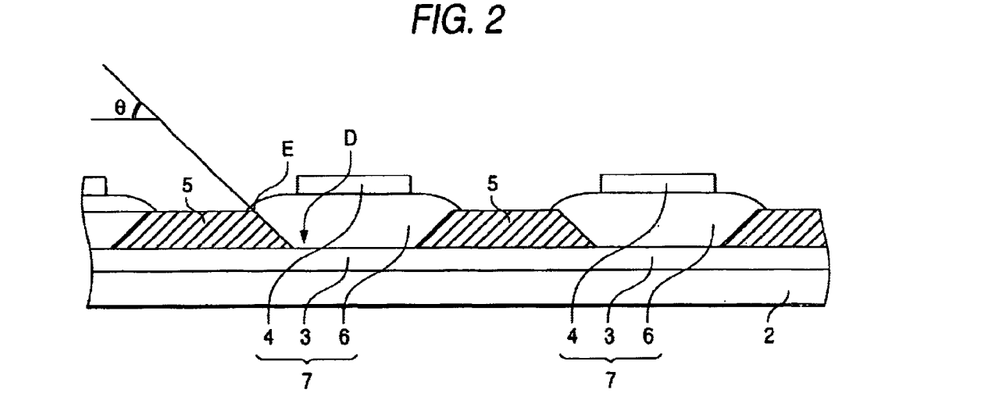
FIG. 2 is a partial sectional view taken in line A—A in the organic EL display panel shown in FIG. 1.
Figure 3:
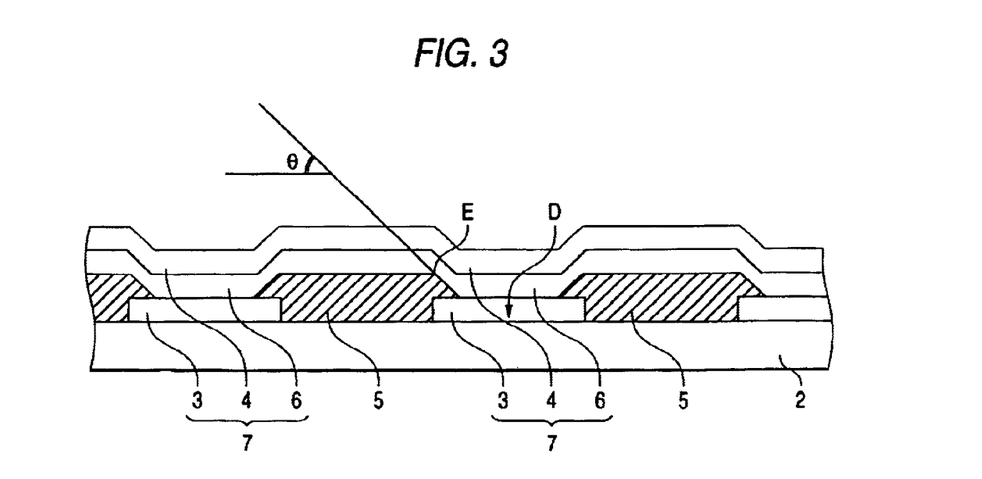
FIG. 3 is a partial sectional view taken in line C—C in the organic EL display panel shown in FIG. 1.

FIG. 2 is a partial sectional view taken in line A—A in the organic EL display panel shown in FIG. 1. FIG. 3 is a partial sectional view taken in line C—C in the organic EL display panel shown in FIG. 1. As seen from FIGS. 2 and 3, the organic EL elements 7 each includes the first display electrode line 3, at least one organic functional layer 6 and the second display electrode line 4, which are successively stacked on the substrate The black insulating film 5 is formed between the respective organic EL elements 7. The outermost surface has a sloping surface which slopes at an angle θ smaller than a vertical angle to the substrate in an area oriented toward the surface D of the substrate. Namely, the apex E of the black insulating film 5 is "tapered". If the sloping angle of the outermost surface of the black insulating layer 5 is vertical or more, the organic functional layer 6 and/or the second display electrode 4 will be separated by the apex of the black insulating film 5. The organic functional layer 6 is peeled from the portion or moisture invasion from this portion will generate a non-light-emitting area. For this reason, the sloping angle of the outermost surface of the black insulating film 5 must be smaller than vertical, i.e. the apex must have a tapered shape.

Each of the organic EL elements 7 is manufactured as follows. First, the anode 3, which is the first display electrode which is transparent and made of indium/tin oxide (ITO), is deposited on a transparent glass substrate 2 by vacuum evaporation or sputtering. The black insulating film 5 is formed on the first display electrode except the area where the pixel is formed by photolithography or like in the first display electrode. The organic functional layer 6 is formed on the black insulating film 5 by successively vacuum-evaporating a hole injection layer of copper phthalocyanine, a hole transporting layer of TPD (triphenylamine derivative) and a light emitting layer of $Alq_3$ (alumi chelate complex) and an electron injection layer of $Li_2O$ (lithium oxide). Further, by vacuum evaporation, the cathode 4 of Al, which is the second display electrode, is deposited on the organic functional layer 6 so that it is opposite to the electrode pattern of the anode 3. Finally, as the measure for humidity resistance, the organic EL element 7 and the black insulating film 5 are covered with a sealing can on which adsorbent capable of adsorbing water is pasted, or an inorganic passivation film (not shown), etc. Thus, the organic EL element display panel is completed.

Figure 4:
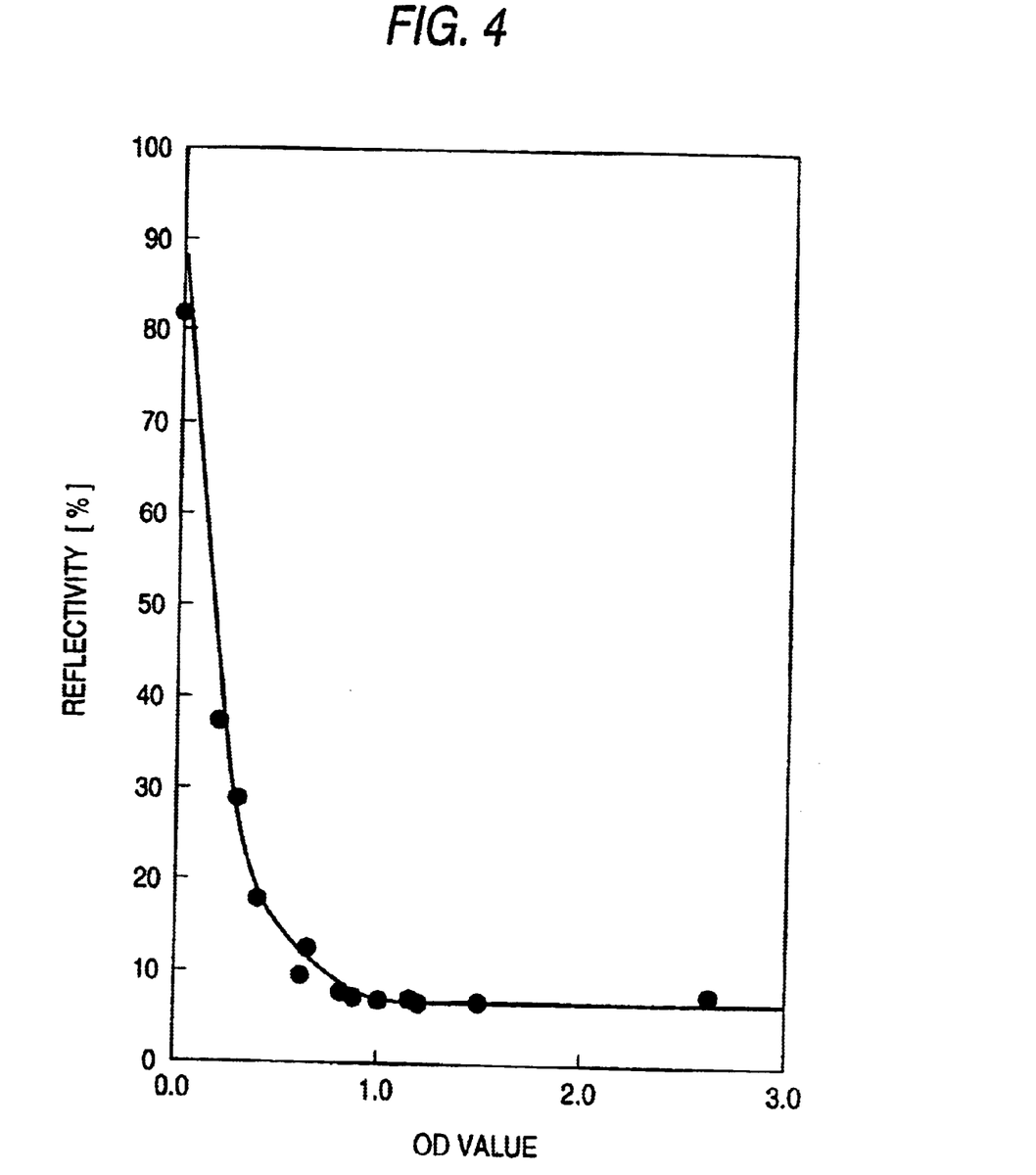
FIG. 4 is a graph showing the relationship between the OD value and reflectance of an insulating film.

In practical use, the black insulating film of the organic EL display panel has preferably reflectance of the order of 10% or less to visible light. Use of the black insulating filmhaving the reflectance larger than this value cannot provide good contrast. In order to overcome such an inconvenience, for the purpose of investigating the relationship between the OD value (log value of the reciprocal of transmittance) and the reflectance of the black insulating film, the black insulating film and Al were successively deposited on the glass substrate equipped with ITO. Under this condition, the OD value of the black insulating film and the reflectance thereof from the glass substrate corresponding to each OD value were measured in a visible light range (400–700 nm). FIG. 4 shows the relationship therebetween. Incidentally, a spectrophotometer which is commercially available was used for measurement of the reflectance.

As seen from FIG. 4, at the OD value of 1.0 or more, the reflectance is fixed to 6–7% regardless with the OD value. Even if the OD value is further enhanced, the reflectance is not improved. On the other hand, if the OD value is lowered, the reflectance abruptly rises at the OD value of 0.5 or less.

Where the black insulating film is used as the black matrix for a liquid crystal display, the transmitted light of backlight must be cut off substantially completely. To this end, the black insulating film must have the OD value of 2.0 or more. On the other hand, in the case of the organic EL display panel, as seen from FIG. 4, if the OD value is 0.5 or more, the black insulating film can have the necessary and minimum reflectance of the order of 10% or less.

Figure 5:
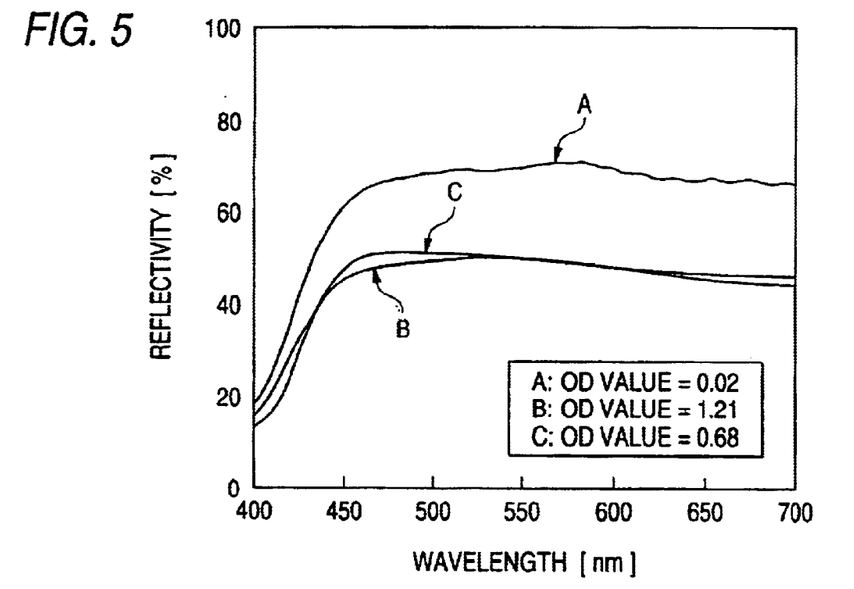
FIG. 5 is a graph showing a change in the reflectance in a visible light range of three insulating films having different OD values.

In order to investigate the reflectance of the organic EL display panel actually, using three kinds of insulating films: a conventional insulating film having the OD value of 0.02, and black insulating films having the OD values of 0.68 and 1.21, respectively, organic EL display panels each having a light emitting area of $1.15 \times 10^{-2} mm^2$ for each pixel and opening rate of 60% were made. Under this condition, the reflectances and their average were measured in the visible light range. The measurement result is shown in FIG. 5.

In the organic EL display panel using the conventional insulating film having the OD value of 0.02, the reflectance is 63.7% in the average. With the black insulating film having the OD value of 0.68, the reflectance is 45.9%, and with the black insulating film having the OD value of 1.21, the reflectance is 45.4%. From such a result, it can be seen that like the result of FIG. 4, the reflectance in the organic EL display panel also falls until the OD value reaches about 0.7 but does not almost fall even when the OD value exceeds 0.7.

Meanwhile, generally, the OD value of the black insulating film is adjusted by the density of carbon or organic pigment which must be contained in the resin which is a material for the black insulating film. The OD value rises as the density of the carbon or organic pigment rises. However, as the density of the organic pigment rises, the fluidity of the resin deteriorates. As a result, after the black insulating film has been formed, the sloping angle of its outermost surface becomes vertical or more. Thus, as described above, the organic functional layer and second display electrode formed on the black insulating film are separated by the apex of the black insulating film, thereby generating a non-light-emitting area.

Further, as the density of carbon increases, the insulating property of the black insulating film deteriorates. In the case of the black matrix of the liquid crystal display, in view of the structure, the insulating property is not required for the black matrix. In the case of the organic EL display panel, in a usual light-emitting step, a forward voltage is applied between the anode and cathode so that a current flows through the element. Thus, the black insulating film is not required to have so high a value as long as it is in a level not causing short-circuiting between the cathode and anode. However, as disclosed in JP-A-4-308687 and JP-A-6-301355, the organic EL display panel requires a step of applying a reverse biasing voltage in which a reverse voltage is applied between the cathode and the anode during non-light-emission for the purpose of suppressing attenuation of the electric characteristic and preventing false light emission due to the leak current supplied to a non-selected pixel. Where the reverse voltage is applied, the organic EL element has a semiconductive characteristic. Therefore, a current is difficult to flow to the element. In this case, if the insulating property of the black insulating film is not sufficient, the current flows toward the black insulating film but not to the element. This cannot provide a sufficient effect of applying the reverse biasing voltage.

Further, where photosensitive resin is used as a material of the black insulating film, a high density of the carbon or pigment in the resin provides a very low transmittance of the film. This gives rise to insufficient exposure when the black insulating film is patterned by photolithography and difficulty to see an alignment mark or anode pattern during mask alignment for patterning, which results in misalignment after the patterning. Further, where the black substance such as the carbon or pigment with a high density is dispersed in the resin, owing to its precipitation and agglomeration, the can-stability of the material deteriorates, or the remainder is apt to remain on the ITO which constitutes the anode after development.

As described above, when the density of the carbon and pigment contained in the resin is increased to increase the OD value, the above disadvantage occurs. For this reason, the density must be adjusted taking this fact into consideration.

In order to investigate the correlation between the OD value of the black insulator and its insulating property and edge shape, several samples were prepared under the conditions described below.

Sample A

Transparent electrodes were patterned in stripes each having a width of 2 mm on a glass substrate. A black insulating film of resin containing carbon with a density of 7% and organic pigment with a density of 7% is deposited thereon. Al films each having a width of 2 mm were deposited substantially perpendicularly to the transparent electrodes.

Sample B

Sample B was prepared under the same condition as sample A except using the black insulating film of the resin containing only carbon with a density of 12%.

Sample C

Sample C was prepared under the same condition as sample A except using the black insulating film of the resin containing only organic pigment with a density of 60%.

Sample D

Sample D was prepared under the same condition as sample A except using the black insulating film of the resin containing carbon with a density of 12% and organic pigment with a density of 38%.

Sample E

Sample E was prepared under the same condition as sample A except using the black insulating film of the resin containing carbon with a density of 16% and organic pigment with a density of 34%.

Sample F

Sample F was prepared under the same condition as sample A except using the black insulating film of the resin containing carbon with a density of 22% and organic pigment with a density of 28%.

Sample G

Sample G was prepared under the same condition as sample A except using the black insulating film of the resin containing only carbon with a density of 30%.

Sample H

Sample H was prepared under the same condition as sample A except using the black insulating film of the resin containing carbon with a density of 30% and an organic pigment with a density of 25%.

For each of the samples thus prepared, a voltage of 1V–30 V was applied at 1V/sec between the transparent electrodes and the Al films. At the time of the applied voltage of 30 V, the density of the current flowing through an area of 2 mm×2 mm of the black insulating film encircled by the transparent electrode and Al film was measured. The maximum value of the applying voltage was set at 30 V because this value corresponds to the maximum driving voltage of the organic EL display panel in matrix driving. For each sample, the shape of the apex of the black in sulating film was also observed. The result acquired for each sample is shown in Table 1.

TABLE 1

| | OD value | Carbon Density % | Organic Pigment Density % | Current Density (A/mm$^2$) | Apex Shape |
|---|---|---|---|---|---|
| Sample A | 0.69 | 7 | 7 | $3.96 \times 10^{-9}$ | taper |
| Sample B | 0.81 | 12 | 0 | $10^{-3}$ or more | taper |
| Sample C | 0.85 | 0 | 60 | $2.06 \times 10^{-10}$ | non-taper |
| Sample D | 1.42 | 12 | 38 | $1.08 \times 10^{-10}$ | non-taper |
| Sample E | 1.45 | 16 | 34 | $2.23 \times 10^{-8}$ | non-taper |

TABLE 1-continued

|  | OD value | Carbon Density % | Organic Pigment Density % | Current Density (A/mm$^2$) | Apex Shape |
|---|---|---|---|---|---|
| Sample F | 1.51 | 22 | 28 | 8.37 × 10$^{-6}$ | non-taper |
| Sample G | 1.68 | 30 | 0 | 10$^{-3}$ or more | taper |
| Sample H | 1.82 | 30 | 25 | 10$^{-3}$ or more | non-taper |

When a reverse voltage of 30 V was applied to the organic EL element, the measured current density of the current flowing through the organic EL element was an order of 10$^{-7}$/mm$^2$. Therefore, when the voltage of 30 V is applied to the black insulating film, if the current density is 10$^{-7}$A/mm$^2$ or more, in the organic EL display panel, in the step of applying the reverse voltage, the current becomes difficult to flow to the organic EL element, but flows to the black insulating film. For this reason, at the applied voltage of 30 V, the black insulating film must provide a current density of at least an order of 10$^{-8}$A/mm$^2$ or less.

In view of the above result, it can be seen that the black insulating film containing carbon with an increased density or only containing the carbon in order to increase the OD value cannot provide sufficient insulating property. If the content density of the organic pigment is increased in order to increase the OD value, the apex of the black insulating film cannot hold a taper shape. In this way, where the OD value is too high, the above bad effects occur in the black insulating film used in the organic EL display panel.

Thus, it can be seen that in practical use, the black insulating film used in the organic EL display panel must satisfy not only the condition that the OD value is 0.5 or more, but also the condition of the property of high insulation and a taper shape of the apex after it has been formed.

Although examples of the measured result are illustrated in Table 1, the OD value and content density of carbon and organic pigment for satisfying the above conditions necessarily vary according to the kind and property of the carbon, organic pigment and resin.

Now, in order to decide the insulating property of the black insulating film quantitatively, the volume resistance was measured for each of the samples A, C and E which have sufficient insulating property enough to be used as the black insulating material of the organic EL display panel from the results shown in Table 1 and the samples F and H which are short of the insulating property. The measured results are shown in Table 2.

|  | Volume Resistance (Ω · cm) |
|---|---|
| Sample A | 1.15 × 10$^{12}$ |
| Sample C | 1.24 × 10$^{12}$ |
| Sample E | 1.05 × 10$^{12}$ |
| Sample F | 9.20 × 10$^{11}$ |
| Sample H | 8.96 × 10$^{11}$ |

As seen from Table 2, in order to exclude the samples F and H which are short of the insulating property, the black insulating film used in the organic EL display panel must have at least the volume resistance of 1.00×10$^{12}$Ω·cm.

Incidentally, this invention can be applied to not only the organic EL display panel as shown in FIGS. 2 and 3, but also the organic EL display panel as disclosed in JP-A-8-315981 in which partitions for polarizing the second electrodes are extended in parallel between the second display electrodes. In this case, the partition for polarizing the second display electrode is formed partially on the outermost surface of the black insulating film between the second display electrodes.

This invention can be applied to not only the organic EL display panel as shown in FIGS. 2 and 3, but also the organic EL display panel in which the insulating films in stripes are formed for only one of between the first display electrodes and between the second display electrodes.

In order to improve the contrast of the organic EL display panel, a lightproof layer such as an ND filter may be provided on the substrate in the organic EL display panel using the black insulating film which satisfies the condition described above.

In order to confirm the effect of improving the contrast by the ND filter, the organic EL display panel which satisfies the condition described later was actually prepared. The reflectance in a visible light range (400–700 nm) of the organic El display panel and the average of the transmittance of the opening were measured.

Embodiment

An ND filter having a transmittance of 45% is provided on the entire outer surface of the substrate of an organic EL display panel and the black insulting film according to this invention in a grid pattern is provided between the organic EL elements. Thus, the organic EL display panel having an opening rate of 40% was prepared. Further, the reflectance in a visible light range (400–700 nm) of the organic El display panel and the transmittance of the opening were measured in the average.

Comparative Example 1

An organic EL display panel was prepared on the same condition as the above embodiment except that a circularly polarizing plate corresponding to a polarizing layer which was usually used is provided in place of the ND filter used in the above embodiment and an ordinary insulating film is provided in place of the black insulating film used in the above embodiment. Further, the reflectance in a visible light range (400–700 nm) of the organic El display panel and the transmittance of the opening were measured in the average.

Comparative Example 2

An organic EL display panel was prepared on the same condition as the above embodiment except that an ordinary insulating film is provided in place of the black insulating film used in the above embodiment. Further, the reflectance in a visible light range (400–700 nm) of the organic El display panel and the transmittance of the opening were measured in the average.

The measured results are shown in Table 3

TABLE 3

|  | Reflectance (%) | Transmittance (%) |
|---|---|---|
| Embodiment (black insulating film + ND filter) | 10.7 | 46.2 |
| Comparative Example 1 (ordinary insulating film + circularly polarizing plate) | 6.3 | 43.5 |
| Comparative Example 2 (ordinary insulating film + ND filter) | 14.7 | 46.2 |

As understood from the above measured results, the reflectance of an order of 10% or less that is a condition giving good contrast was acquired in the organic EL display panel according to the embodiment, in which the ND filter is provided on the substrate surface of the organic EL display panel.

In the embodiment, although the ND filter having a transmittance of 45% was adopted, the ND filter can have a further decreased reflectance by decreasing the transmittance. For this reason, by adopting the ND filter having transmittance approximately equal to that in Comparative Example 1 and the black insulating film according to this invention, the reflectance of the organic EL display panel can be restrained to the magnitude approximately equal to that in Comparative Example 1.

Further, since the transmittance of the ND filter can be varied to any optional value, the ND filter having an optical density most suited to a using environment.

Angle dependency of the reflectance of the circularly polarizing plate corresponding to the ordinary polarizing layer and the ND filter used in this invention is shown in each of FIGS. 6 to 9.

Figure 6:
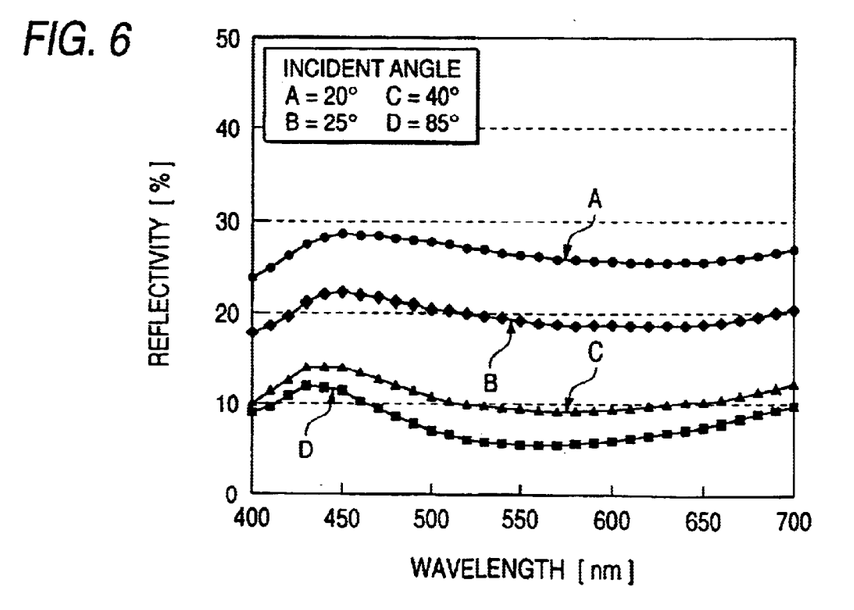
FIG. 6 is a graph showing angle dependency of the reflectance in a visible light range of a circularly polarizing plate.
Figure 7:
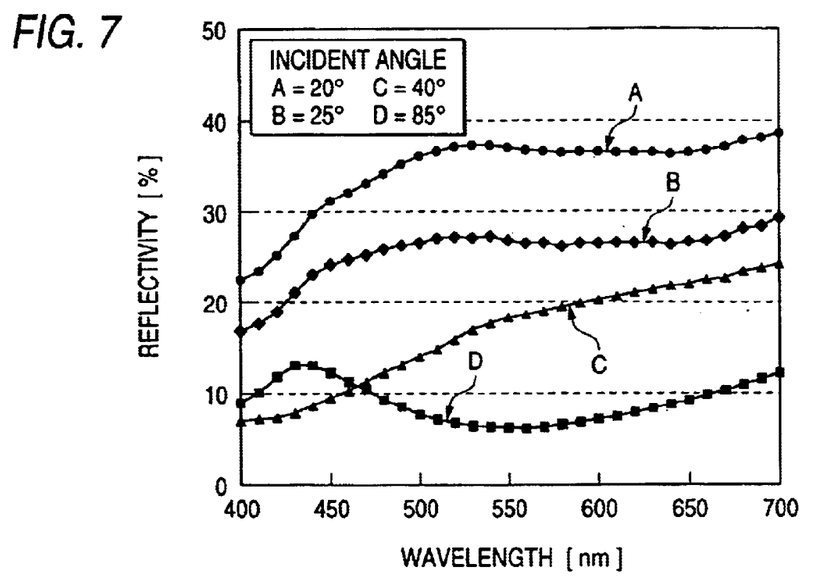
FIG. 7 is a graph showing angle dependency of the reflectance in a visible light range of a circularly polarizing plate.
Figure 8:
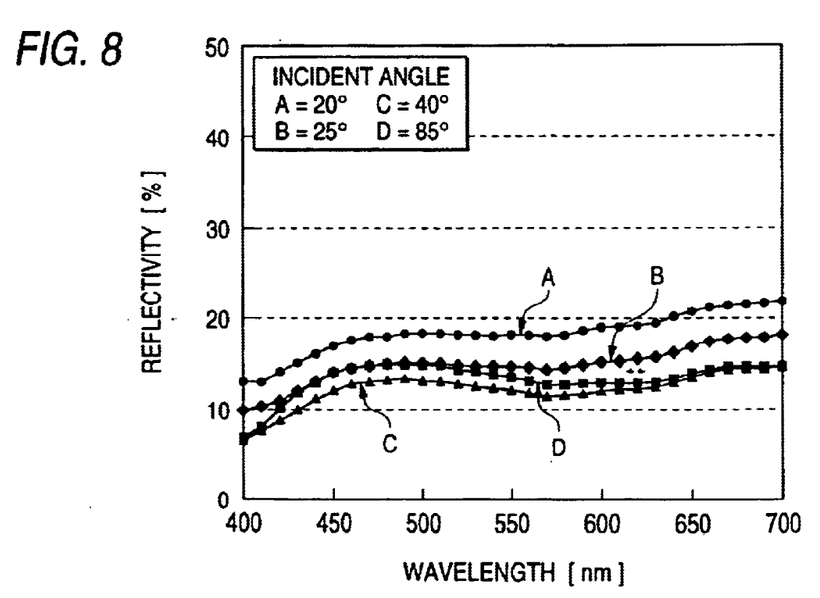
FIG. 8 is a graph showing angle dependency of the reflectance in a visible light range of an ND filter.
Figure 10:
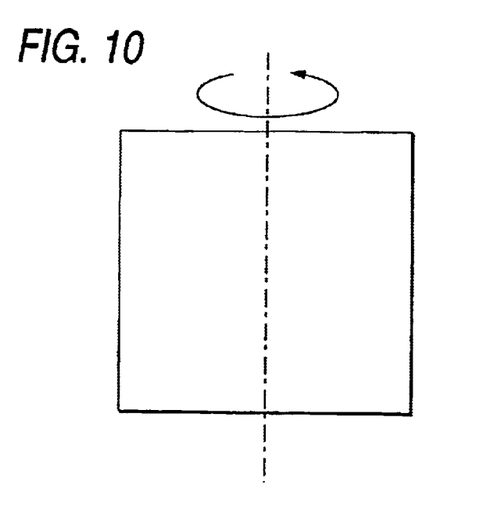
FIG. 10 is a view for explaining the method of measuring the angle dependency of the reflectance of an ND filter and a circularly polarizing plate.
Figure 11:
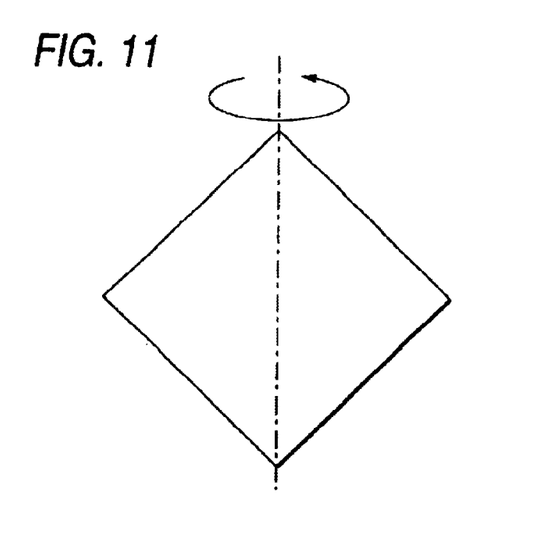
FIG. 11 is a view for explaining the method of measuring the angle dependency of the reflectance of a circularly polarizing plate.
Figure 12:
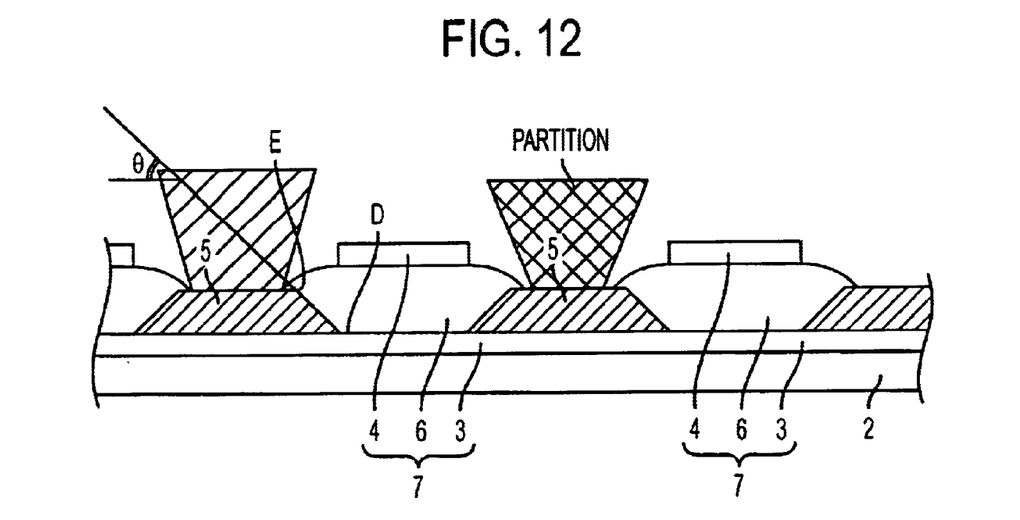
FIG. 12 is a view showing one modification of the organic EL display panel shown in FIG. 2.
Figure 13:
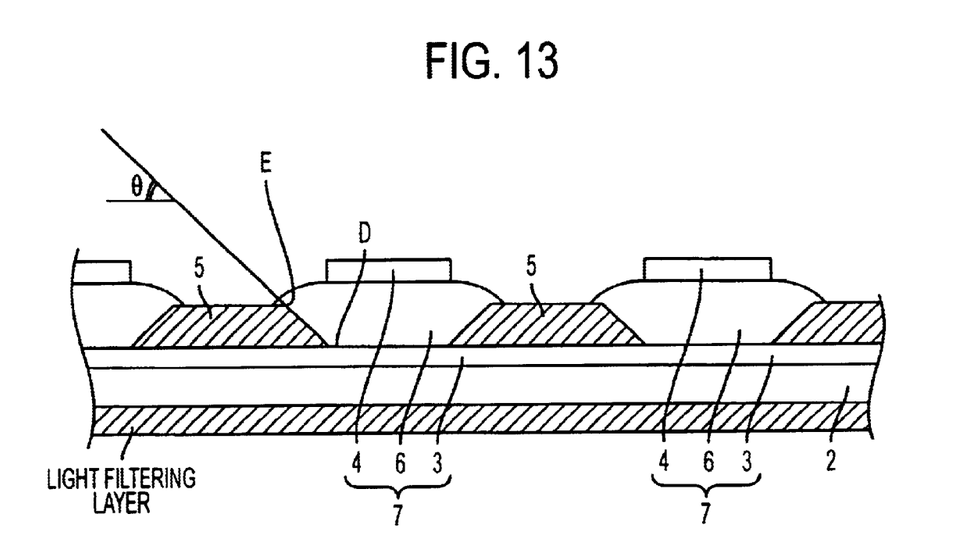
FIG. 13 is a view showing another modification of the organic EL display panel shown in FIG. 2.

FIG. 6 shows a graph of the relationship between the reflectance for each of view angles and wavelength of the reflected light when a square circularly polarizing plate is rotated around the center line connecting the centers of opposite two sides of the square as shown in FIG. 10. FIG. 7 shows a graph of the relationship between the reflectance for each of view angles and wavelength of the reflected light when a square circularly polarizing plate is rotated around the diagonal line of the square as shown in FIG. 11. FIG. 8 shows a graph of the relationship between the reflectance for each of view angles and wavelength of the reflected light when a square ND filter having a transmittance of 45% is rotated around the center line connecting the centers of opposite two sides of the square as shown in FIG. 10.

Figure 9:
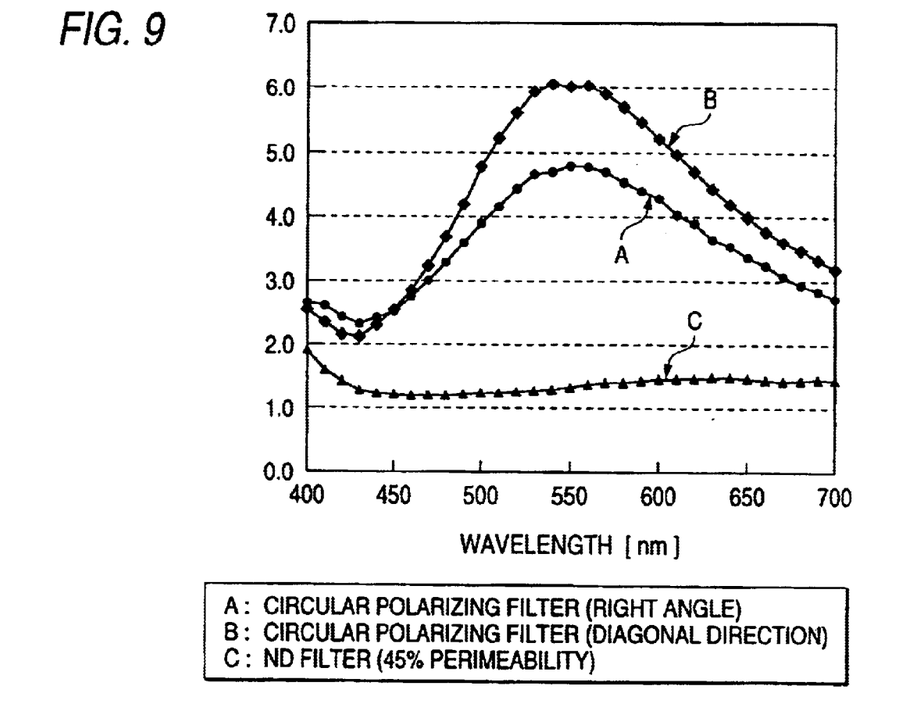
FIG. 9 is a graph showing angle dependency of the reflectance in a visible light range of an ND filter and a circularly polarizing plate.

FIG. 9 is a graph shown the reflectance and wavelength when the reflectance of a view angle of 20° is normalized assuming that the reflectance at the view angle of 85° is 1 on the basis of the measured results.

As seen from FIG. 9, in the range of the wavelength of e.g. 500–600 nm, in the circularly polarizing plate, the reflectance at the view angle of 20° is about four to six times as large as that at the view angle of 85°. On the other hand, the ND filter does not have almost such angle dependency. Further, for each spectrum of the reflected light, the circularly polarizing plate has a larger variation in the reflectance than the ND filter has.

As understood from the above description, the organic EL display panel in which the light-proofing layer such as the ND filter is formed on the substrate in place of the ordinary polarizing layer can provide good contrast without spoiling the merit of a wider view angle than that in liquid crystal display because it gives self-emitting light.

Incidentally, in this embodiment, although the ND filter was formed on the substrate surface to constitute a light-proofing layer, the substrate itself may be used as the light-proofing layer, for example, the ND filter may be used as the substrate, thereby providing the same effect. Further, the ND filter or light-proofing substrate can be subjected to AR processing (which decreases the reflectance using the interference of light) or AG processing (which decreases the reflectance using the scattering of light) so that the reflectance of the organic EL display panel can be decreased, thereby providing good contrast.

In accordance with this invention, by setting an appropriate OD value for the insulating film used in an organic EL display panel, the organic EL display panel can be provided which gives improved contrast with a low reflectance.

By defining the volume resistance and shape of the insulating film, a reliable organic EL display panel can be provided.

By forming a light-proofing layer on the surface of the substrate or using a light-proofing substrate, the organic EL display panel can be provided which gives more improved contrast.

What is claimed is:

1. An organic electroluminescence (EL) display panel comprising:
   an insulating film; and
   a plurality of EL elements arranged through said insulating film, each of said EL elements including a first display electrode, at least one organic functional layer containing a light emitting layer of organic compound and a second display electrode which are successively stacked on a substrate,
   wherein said insulating film has an optical density value of 0.5 or more in a visible light range and a current density less than that of the EL elements when a reverse voltage is applied to the insulating film.

2. The organic EL display panel according to claim 1, wherein said insulating film has a current density of $10^{-8}$ A/MM$^2$ or less when a voltage of 30 V is applied.

3. The organic EL display panel according to claim 1, wherein said insulating film has a volume resistance of $1.0 \times 10^{12} \cdot \Omega$cm or more.

4. The organic EL display panel according to claim 1, wherein an outermost surface of said insulating film has a sloping surface which slopes at an angle smaller than a vertical angle to said substrate in an area oriented toward the surface of said substrate.

5. The organic EL display panel according to claim 1, wherein said insulating film is formed in a grid pattern at least a part between said organic EL display elements.

6. The organic EL display panel according to claim 1, wherein said insulating film has a partition on at least a portion of an outermost surface of said insulating film.

7. The organic EL display panel according to claim 1, further comprising a light filtering layer on the surface of said substrate.

8. The organic EL display panel according to claim 7, wherein said light filtering layer is an ND filter.

9. The organic EL display panel according to claim 1, wherein said substrate is a light filtering substrate.

10. The organic EL display panel according to claim 9, wherein said light filtering substrate is an ND filter.

11. An organic electroluminescence (EL) display panel comprising:
    an insulating film; and
    a plurality of EL elements arranged through said insulating film, each of said EL elements including a first display electrode, at least one organic functional layer containing a light emitting layer of organic compound and a second display electrode which are successively stacked on a substrate,
    wherein said insulating film has an optcal density value of from 0.5 to 1.82 in a visible light range.

12. The organic EL display panel according to claim 11, wherein said insulating film has a current density of $10^{-8}$ A/mm$^2$ or less when a voltage of 30 V is applied.

13. The organic EL display panel according to claim 11, wherein said insulating film has a volume resistance of $1.0 \times 10^{12} \cdot \Omega$cm or more.

14. The organic EL display panel according to claim 11, wherein an outermost surface of said insulating film has a sloping surface which slopes at an angle smaller than a vertical angle to said substrate in an area oriented toward the surface of said substrate.

15. The organic EL display panel according to claim 11, wherein said insulating film is formed in a grid pattern at least a part between said organic EL display elements.

16. The organic EL display panel according to claim 11, wherein said insulating film has a partition on at least a portion of an outermost surface of said insulating film.

17. The organic EL display panel according to claim 11, further comprising a light filtering layer on the surface of said substrate.

18. The organic EL display panel according to claim 17, wherein said light filtering layer is an ND filter.

19. The organic EL display panel according to claim 11, wherein said substrate is a light filtering substrate.

20. The organic EL display panel according to claim 19, wherein said light filtering substrate is an ND filter.

21. An organic electroluminescence (EL) display panel comprising:

an insulating film; and a plurality of EL elements arranged through said insulating film, each of said EL elements including a first display electrode, at least one organic functional layer containing a light emitting layer of organic compound and a second display electrode which are successively stacked on a substrate, wherein said insulating film has an optical density valve of 0.5 or more in a visible light range and an outermost surface of said insulating film has a sloping surface which slopes at an angle smaller than a vertical angle to said substrate in an area oriented toward the surface of said substrate.

22. The organic EL display panel according to claim 21, wherein said insulating film has a current density of $10^{-8}$ A/mm$^2$ or less when a voltage of 30 V is applied.

23. The organic EL display panel according to claim 21 wherein said insulating film has a volume resistance of $1.0 \times 10^{12} \cdot \Omega$cm or more.

24. The organic EL display panel according to claim 21, wherein said insulating film is formed in a grid pattern at least a part between said organic EL display elements.

25. The organic EL display panel according to claim 21, wherein said insulating film has a partition on at least a portion of an outermost surface of said insulating film.

26. The organic EL display panel according to claim 21, further comprising a light filtering layer on the surface of said substrate.

27. The organic EL display panel according to claim 26, wherein said light filtering layer is an ND filter.

28. The organic EL display panel according to claim 21, wherein said substrate is a light filtering substrate.

29. The organic EL display panel according to claim 28, wherein said light filtering substrate is an ND filter.

* * * * *